United States Patent
Takamine

(10) Patent No.: US 9,667,225 B2
(45) Date of Patent: May 30, 2017

(54) SURFACE ACOUSTIC WAVE FILTER, SURFACE ACOUSTIC WAVE FILTER DEVICE, AND DUPLEXER INCLUDING A SHARED REFLECTOR

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 14/934,394

(22) Filed: Nov. 6, 2015

(65) Prior Publication Data

US 2016/0065175 A1 Mar. 3, 2016

Related U.S. Application Data

(63) Continuation of application No. PCT/JP2014/055916, filed on Mar. 7, 2014.

(30) Foreign Application Priority Data

Jun. 13, 2013 (JP) ................................. 2013-124699

(51) Int. Cl.
*H03H 9/64* (2006.01)
*H03H 9/72* (2006.01)
(Continued)

(52) U.S. Cl.
CPC ............ *H03H 9/643* (2013.01); *H03H 9/008* (2013.01); *H03H 9/0071* (2013.01);
(Continued)

(58) Field of Classification Search
CPC .... H03H 9/0071; H03H 9/008; H03H 9/0085; H03H 9/02637; H03H 9/02685;
(Continued)

(56) References Cited

U.S. PATENT DOCUMENTS

| | | | |
|---|---|---|---|
| 5,790,000 A * | 8/1998 | Dai ...................... | H03H 9/0038 310/313 B |
| 6,424,240 B1 * | 7/2002 | Yoshikawa .......... | H03H 9/6436 310/313 D |

(Continued)

FOREIGN PATENT DOCUMENTS

CN 101529722 A 9/2009
DE 198 18 038 A1 * 11/1999
(Continued)

OTHER PUBLICATIONS

English language machine translation of JP 2006-186433, published Jul. 13, 2006, 6 pages.*

(Continued)

*Primary Examiner* — Barbara Summons
(74) *Attorney, Agent, or Firm* — Keating & Bennett, LLP

(57) ABSTRACT

A surface acoustic wave filter includes a longitudinally coupled resonator first filter section and a longitudinally coupled resonator second filter section that is electrically connected to the first filter section in parallel or in series and that is provided next to the first filter section in a surface acoustic wave propagation direction. The first filter section includes a first interdigital transducer group arranged in the surface acoustic wave propagation direction. The second filter section includes a second interdigital transducer group arranged in the surface acoustic wave propagation direction. A reflector between the first interdigital transducer group and the second interdigital transducer group is an integrated shared reflector. A number of electrode fingers in reflecting units in the shared reflector is an odd number of no less than nine.

16 Claims, 11 Drawing Sheets

(51) Int. Cl.
*H03H 9/02* (2006.01)
*H03H 9/00* (2006.01)
*H03H 9/145* (2006.01)

(52) U.S. Cl.
CPC ...... *H03H 9/0085* (2013.01); *H03H 9/02637* (2013.01); *H03H 9/64* (2013.01); *H03H 9/6433* (2013.01); *H03H 9/725* (2013.01); *H03H 9/14588* (2013.01)

(58) Field of Classification Search
CPC .. H03H 9/02724; H03H 9/14588; H03H 9/64; H03H 9/643; H03H 9/6433; H03H 9/6469; H03H 9/6496; H03H 9/725
USPC .......... 333/133, 193–196; 310/313 B, 313 D
See application file for complete search history.

(56) References Cited

U.S. PATENT DOCUMENTS

| | | | | |
|---|---|---|---|---|
| 7,078,989 B2 * | 7/2006 | Inoue | ................ | H03H 9/02685 333/133 |
| 7,880,561 B2 * | 2/2011 | Takamine | ............ | H03H 9/0061 333/133 |
| 2002/0017969 A1 | 2/2002 | Takamine | | |
| 2004/0207491 A1 | 10/2004 | Nakaya et al. | | |
| 2007/0159269 A1 * | 7/2007 | Taniguchi | .............. | H03H 9/008 333/133 |
| 2007/0290770 A1 | 12/2007 | Otsuka et al. | | |
| 2009/0179715 A1 | 7/2009 | Takamine | | |

FOREIGN PATENT DOCUMENTS

| | | | |
|---|---|---|---|
| JP | 03-283710 A | * | 12/1991 |
| JP | 2000-201048 A | * | 7/2000 |
| JP | 2003-174350 A | | 6/2003 |
| JP | 2004-304513 A | | 10/2004 |
| JP | 2005-072992 A | | 3/2005 |
| JP | 2006-087145 A | | 3/2006 |
| JP | 2006-186433 A | | 7/2006 |
| JP | 2007-300604 A | | 11/2007 |
| JP | 2008-085720 A | | 4/2008 |

OTHER PUBLICATIONS

English language machine translation of JP 2000-201048, published Jul. 18, 2000, 3 pages.*
English language machine translation of JP 03-283710, published Dec. 13, 1991, 4 pages.*
Official Communication issued in International Patent Application No. PCT/JP2014/055916, mailed on May 13, 2014.
Official Communication issued in corresponding Chinese Patent Application No. 201480033429.9, mailed on Mar. 27, 2017.

* cited by examiner

INSERTION LOSS

FREQUENCY

INSERTION LOSS

FREQUENCY

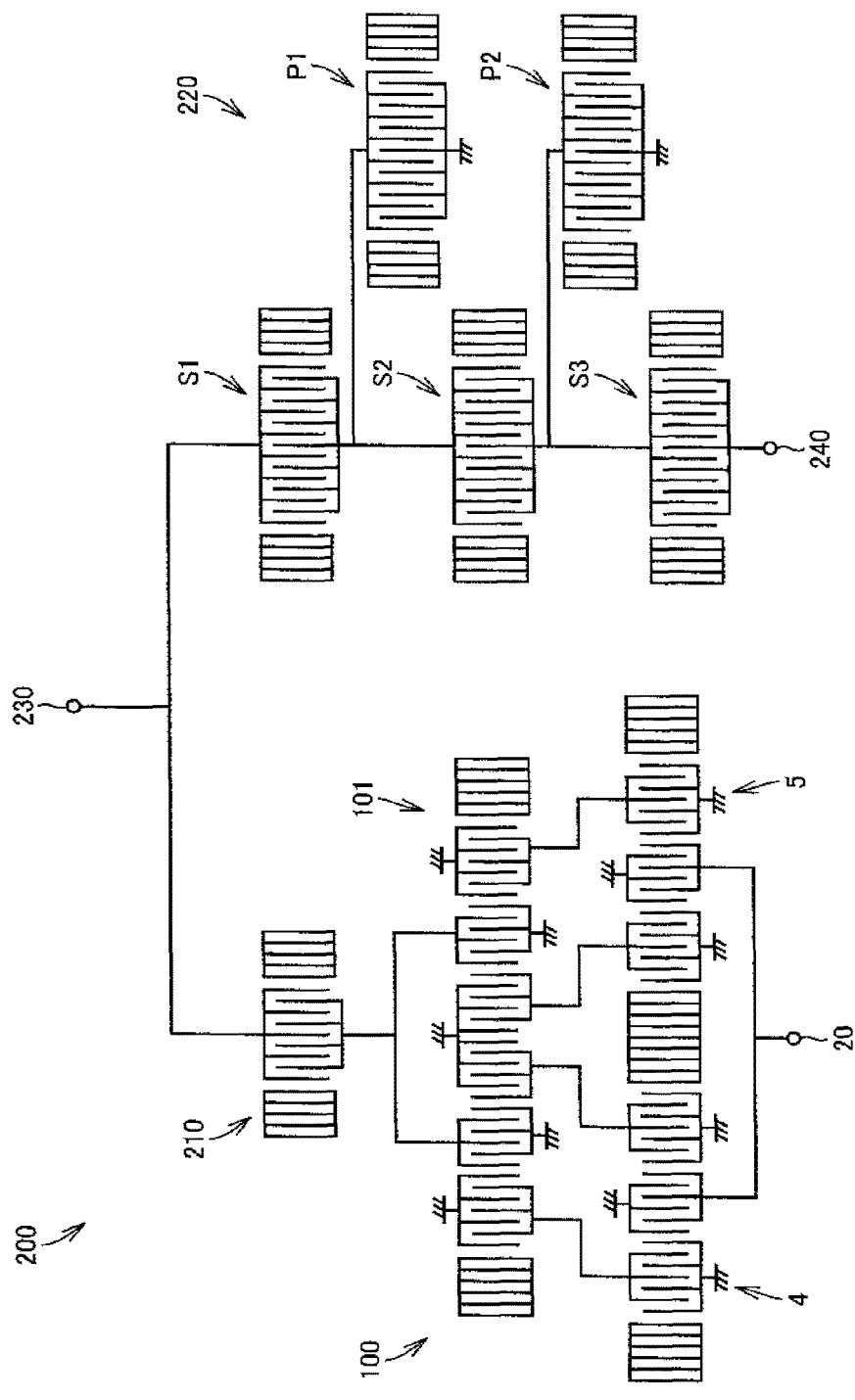

SURFACE ACOUSTIC WAVE FILTER, SURFACE ACOUSTIC WAVE FILTER DEVICE, AND DUPLEXER INCLUDING A SHARED REFLECTOR

BACKGROUND OF THE INVENTION

1. Field of the Invention

The present invention relates to surface acoustic wave filters, surface acoustic wave filter devices, and duplexers. The present invention particularly relates to surface acoustic wave filters that include a plurality of longitudinally coupled resonant filters, as well as to surface acoustic wave filter devices and duplexers that include such surface acoustic wave filters.

2. Description of the Related Art

A conventional surface acoustic wave filter is disclosed in, for example, Japanese Unexamined Patent Application Publication No. 2006-186433, which discloses a configuration in which a plurality of longitudinally coupled-type surface acoustic wave filters are disposed along a propagation direction of surface acoustic waves and electrically connected in parallel, and reflectors are shared between mutually adjacent longitudinally coupled-type surface acoustic wave filters. Japanese Unexamined Patent Application Publication No. 2006-186433 further discloses that when the number of electrode fingers in reflectors that are not shared is taken as N, it is desirable for the number of shared reflectors to be no less than 2 and less than 2N.

SUMMARY OF THE INVENTION

The inventors of the present invention discovered that when reflectors are shared between mutually adjacent longitudinally coupled-type surface acoustic wave filters, there is a problem in that ripples will arise within pass-bands if the characteristics of the surface acoustic waves that propagate to the shared reflectors from the respective longitudinally coupled-type surface acoustic wave filters differ.

Having been achieved in light of the aforementioned problem, preferred embodiments of the present invention provide a technique capable of significantly reducing or preventing ripples in a surface acoustic wave filter in which reflectors are shared.

The inventors of the present invention diligently considered reasons why ripples occur in the pass-band when a shared reflector is applied. The inventors subsequently discovered that in the case where the surface acoustic waves that propagate through the shared reflector from the respective longitudinally coupled-type surface acoustic wave filters have different characteristics, the surface acoustic wave transmitted toward the shared reflector and a surface acoustic wave that escapes from the shared reflector will have different phases, and as a result, the surface acoustic wave that escapes from the shared reflector will be an unnecessary wave. Based on this, the inventors discovered that if the phase of the surface acoustic wave that escapes from the shared reflector can be adjusted so as not to be inverted relative to the phase of the surface acoustic wave transmitted toward the shared reflector, the occurrence of ripples in the pass-band is able to be significantly reduced or prevented even in the case where the reflector is shared, and hence conceived of and developed preferred embodiments of the present invention.

That is, a surface acoustic wave filter according to an aspect of various preferred embodiments of the present invention includes a piezoelectric substrate, a longitudinally coupled resonator first filter section, and a longitudinally coupled resonator second filter section. The first filter section is provided on the piezoelectric substrate. The second filter section is electrically connected to the first filter section in parallel or in series on at least one of an input signal side and an output signal side. The second filter section is provided on the piezoelectric substrate next to the first filter section in a surface acoustic wave propagation direction. The first filter section includes a first interdigital transducer group including a plurality of interdigital transducers arranged in the surface acoustic wave propagation direction and a pair of first reflectors disposed on each side of the first interdigital transducer group in the surface acoustic wave propagation direction. The second filter section includes a second interdigital transducer group including a plurality of interdigital transducers arranged in the surface acoustic wave propagation direction and a pair of second reflectors disposed on each side of the second interdigital transducer group in the surface acoustic wave propagation direction. The first reflector and the second reflector disposed between the first interdigital transducer group and the second interdigital transducer group are defined by an integrated shared reflector. A number of electrode fingers in the reflecting units in the shared reflector preferably is an odd number of no less than nine, for example.

According to another aspect of various preferred embodiments of the surface acoustic wave filter, it is preferable for the pair of first reflectors to include the shared reflector and a non-shared reflector that is not integrated with the second reflector, and for an interval between the shared reflector and an interdigital transducer, of the plurality of interdigital transducers in the first interdigital transducer group, that is adjacent to the shared reflector, to be different from an interval between the non-shared reflector and an interdigital transducer, of the plurality of interdigital transducers in the first interdigital transducer group, that is adjacent to the non-shared reflector.

A surface acoustic wave filter device according to an aspect of various preferred embodiments of the present invention includes the surface acoustic wave filter according to any one of the aforementioned aspects of preferred embodiments of the present invention and a second surface acoustic wave filter cascade-connected to the surface acoustic wave filter.

According to another aspect of various preferred embodiments of the surface acoustic wave filter device, it is preferable for a pair of interconnects that define a cascading connection between the surface acoustic wave filter and the second surface acoustic wave filter to be further provided, and for a phase of one signal transmitted through one interconnect in the pair of interconnects and a phase of another signal transmitted through the other interconnect in the pair of interconnects to be mutually opposite.

According to another aspect of various preferred embodiments of the surface acoustic wave filter device, it is preferable for the second surface acoustic wave filter to include a first interdigital transducer, a second interdigital transducer, a third interdigital transducer, a fourth interdigital transducer, and a fifth interdigital transducer arranged in that order in the surface acoustic wave propagation direction. According to another aspect thereof, it is preferable for the third interdigital transducer to be divided into a first partial interdigital transducer portion and a second partial interdigital transducer portion on both sides in the surface acoustic wave propagation direction, where the first partial interdigital transducer portion is cascade-connected to the first filter section, and the second partial interdigital transducer portion is cascade-connected to the second filter section.

A duplexer according to an aspect of various preferred embodiments of the present invention includes the surface acoustic wave filter according to any one of the aforementioned aspects of various preferred embodiments of the present invention or the surface acoustic wave filter device according to any one of the aforementioned aspects of various preferred embodiments of the present invention.

According to various preferred embodiments of the present invention, ripples are significantly reduced or prevented in a surface acoustic wave filter in which a reflector is shared.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 16 is a schematic plan view illustrating a duplexer including the surface acoustic wave filter device according to the fourth preferred embodiment of the present invention.

DETAILED DESCRIPTION OF THE PREFERRED EMBODIMENTS

Figure 1:
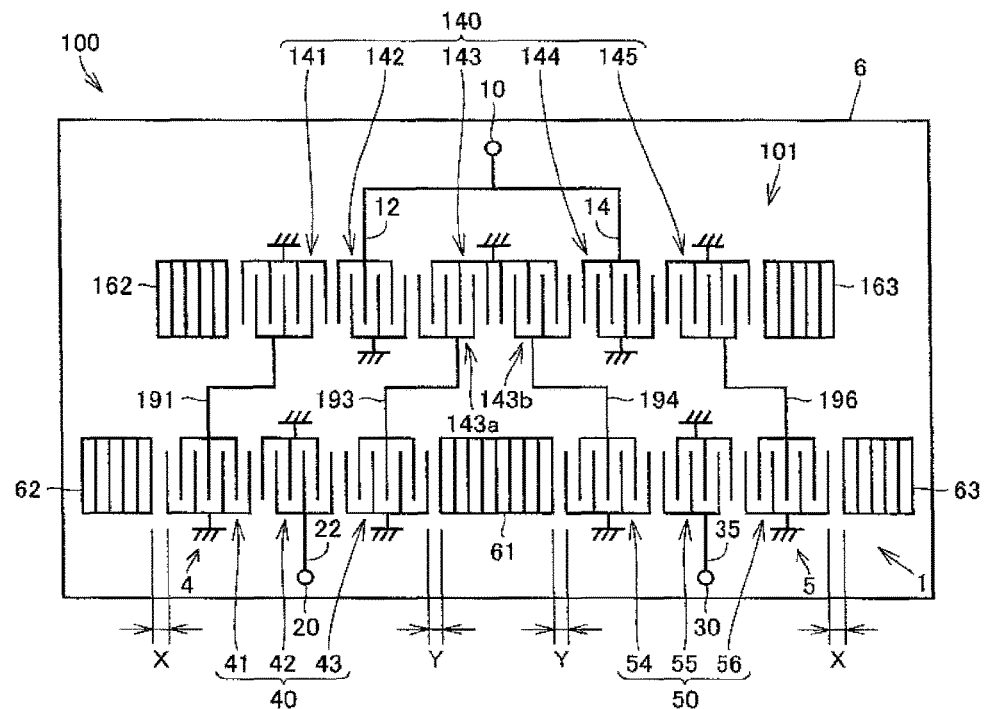
FIG. 1 is a schematic plan view illustrating the overall configuration of a surface acoustic wave filter device according to a first preferred embodiment of the present invention.

Hereinafter, preferred embodiments of the present invention will be described based on the drawings. Note that in the drawings mentioned hereinafter, identical or corresponding elements are assigned identical reference numerals, and descriptions thereof will not be repeated.

First Preferred Embodiment

FIG. 1 is a schematic plan view illustrating the overall configuration of a surface acoustic wave filter device 100 according to a first preferred embodiment of the present invention. As shown in FIG. 1, the surface acoustic wave filter device 100 according to the first preferred embodiment includes a first surface acoustic wave filter 1 (also called a "SAW (surface acoustic wave) filter 1" hereinafter) and a surface acoustic wave filter 101 defining and functioning as a second surface acoustic wave filter that is different from the surface acoustic wave filter 1 (also called a "SAW filter 101" hereinafter). The surface acoustic wave filters 1 and 101 are configured by providing electrode structures as shown in the drawings on a primary surface of a piezoelectric substrate 6. The surface acoustic wave filters 1 and 101 have a two-stage cascading connection.

Note that in the present preferred embodiment, it is assumed that a direction along which surface acoustic waves propagate in the surface acoustic wave filter 1 and a direction along which surface acoustic waves propagate in the surface acoustic wave filter 101 are parallel or substantially parallel to each other (a horizontal direction, in FIG. 1).

The SAW filter 1 includes a longitudinally coupled resonator first filter section 4 and a longitudinally coupled resonator second filter section 5. The first filter section 4 and the second filter section 5 are provided on the piezoelectric substrate 6, and are disposed adjacent to each other in the surface acoustic wave propagation direction. The second filter section 5 is provided next to the first filter section 4 in the surface acoustic wave propagation direction.

The first filter section 4 includes a first interdigital transducer (IDT) group 40. The first IDT group 40 includes a plurality of IDTs, namely an IDT 41 defining and functioning as a first IDT, an IDT 42 defining and functioning as a second IDT, and an IDT 43 defining and functioning as a third IDT, for a total of three IDTs. The IDT 41, the IDT 42, and the IDT 43 are arranged in that order in the surface acoustic wave propagation direction. A reflector 61 is disposed on one side of the first IDT group 40 in the surface acoustic wave propagation direction. A reflector 62 is disposed on another side of the first IDT group 40 in the surface acoustic wave propagation direction. The reflectors 61 and 62 define a pair of first reflectors disposed on both sides of the first IDT group 40 in the surface acoustic wave propagation direction. The first filter section 4 is a three IDT-type longitudinally coupled resonator surface acoustic wave filter.

The second filter section 5 includes a second IDT group 50. The second IDT group 50 includes a plurality of IDTs, namely an IDT 54 defining and functioning as a first IDT, an IDT defining and functioning as a second IDT, and an IDT 56 defining and functioning as a third IDT, for a total of three IDTs. The IDT 54, the IDT 55, and the IDT 56 are arranged in that order in the surface acoustic wave propagation direction. The reflector 61 is disposed on one side of the second IDT group in the surface acoustic wave propagation direction. A reflector 63 is disposed on another side of the second IDT group in the surface acoustic wave propagation direction. The reflectors 61 and 63 define a pair of second reflectors disposed on both sides of the second IDT group 50 in the surface acoustic wave propagation direction. The second filter section 5 is a three IDT-type longitudinally coupled resonator surface acoustic wave filter.

The SAW filter 101 includes a third IDT group 140. The third IDT group 140 includes a plurality of IDTs, namely an IDT 141 defining and functioning as a first IDT, an IDT 142 defining and functioning as a second IDT, an IDT 143 defining and functioning as a third IDT, an IDT 144 defining and functioning as a fourth IDT, and an IDT 145 defining and functioning as a fifth IDT, for a total of five IDTs. The IDT 141, the IDT 142, the IDT 143, the IDT 144, and the IDT 145 are arranged in that order in the surface acoustic wave propagation direction. A reflector 162 is disposed on one side of the third IDT group 140 in the surface acoustic wave propagation direction. A reflector 163 is disposed on another side of the third IDT group 140 in the surface acoustic wave propagation direction. The reflectors 162 and 163 define a pair of third reflectors disposed on both sides of the third IDT group 140 in the surface acoustic wave propagation direction. The SAW filter 101 is a five IDT-type longitudinally coupled resonator surface acoustic wave filter.

The IDT 143 in the center of the third IDT group 140 is divided into two portions in a central area along the surface acoustic wave propagation direction. That is, as a result of the division, the IDT 143 includes a first partial IDT portion 143a and a second partial IDT portion 143b on both sides in the surface acoustic wave propagation direction. The first partial IDT portion 143a and the second partial IDT portion 143b are arranged in that order in the surface acoustic wave propagation direction.

The surface acoustic wave filter device 100 also includes an input terminal 10 and a pair of output terminals 20 and 30. The IDTs 141, 142, 143, 144, and 145 include pairs of comb tooth-shaped electrodes disposed opposite to each other so that respective electrode fingers are adjacent to each other. Likewise, the IDTs 41, 42, and 43 include pairs of comb tooth-shaped electrodes disposed opposite to each other so that respective electrode fingers are adjacent to each other. Furthermore, the IDTs 54, 55, and 56 include pairs of comb tooth-shaped electrodes disposed opposite to each other so that respective electrode fingers are adjacent to each other.

When a side of the piezoelectric substrate 6 on which the input terminal 10 is located is taken as a first side, and another side of the piezoelectric substrate 6, opposite to the side near which the input terminal 10 is disposed and near which the output terminals 20 and 30 are disposed, is taken as a second side, one comb tooth-shaped electrode of the IDT 141 on the first side is shunted to ground. The other comb tooth-shaped electrode of the IDT 141 on the second side is connected to one comb tooth-shaped electrode of the IDT 41 on the first side, via a signal line 191 that defines and function as an interstage connecting line. One comb tooth-shaped electrode of the IDT 142 on the first side is connected to the input terminal 10 via a signal line 12. The other comb tooth-shaped electrode of the IDT 142 on the second side is shunted to ground.

One comb tooth-shaped electrode of the IDT 143 on the first side is not divided but is shared in the surface acoustic wave propagation direction, and is shunted to ground. The other comb tooth-shaped electrode of the IDT 143 on the second side is divided, with the first partial IDT portion 143a and the second partial IDT portion 143b being provided as a result. Of the comb tooth-shaped electrode divided in the surface acoustic wave propagation direction, a side closer to the IDT 142 defines the first partial IDT portion 143a, whereas a side closer to the IDT 144 defines the second partial IDT portion 143b. The first partial IDT portion 143a is connected, via a signal line 193 defining and functioning as an interstage connecting line, to one comb tooth-shaped electrode of the IDT 43 on the first side that is a portion of the first filter section 4. The second partial IDT portion 143b is connected, via a signal line 194 defining and functioning as an interstage connecting line, to one comb tooth-shaped electrode of the IDT 54 on the first side that is a portion of the second filter section 5. Of the electrode fingers in the one comb tooth-shaped electrode of the IDT 143 on the first side, there is an even number of electrode fingers between the first partial IDT portion 143a and the second partial IDT portion 143b. Specifically, there is an even number in the one comb tooth-shaped electrode of the IDT 143 on the first side that is interposed between the other comb tooth-shaped electrode of the first partial IDT portion 143a on the second side and the other comb tooth-shaped electrode of the second partial IDT portion 143b on the second side.

One comb tooth-shaped electrode of the IDT 144 on the first side is connected to the input terminal 10 via a signal line 14. The other comb tooth-shaped electrode of the IDT 144 on the second side is shunted to ground. One comb tooth-shaped electrode of the IDT 145 on the first side is shunted to ground. The other comb tooth-shaped electrode of the IDT 145 on the second side is connected to one comb tooth-shaped electrode of the IDT 56 on the first side, via a signal line 196 that defines and functions as an interstage connecting line.

One comb tooth-shaped electrode of the IDT 41 on the first side is connected to the other comb tooth-shaped electrode of the IDT 141 on the second side, via the signal line 191 that defines and functions as an interstage connecting line. The other comb tooth-shaped electrode of the IDT 41 on the second side is shunted to ground. One comb tooth-shaped electrode of the IDT 42 on the first side is shunted to ground. The other comb tooth-shaped electrode of the IDT 42 on the second side is connected to the output terminal 20 via a signal line 22. The one comb tooth-shaped electrode of the IDT 43 on the first side is connected to the first partial IDT portion 143a via the signal line 193 that defines and functions as an interstage connecting line. The other comb tooth-shaped electrode of the IDT 43 on the second side is shunted to ground.

The one comb tooth-shaped electrode of the IDT 54 on the first side is connected to the second partial IDT portion 143b via the signal line 194 that defines and functions as an interstage connecting line. The other comb tooth-shaped electrode of the IDT 54 on the second side is shunted to ground. One comb tooth-shaped electrode of the IDT 55 on the first side is shunted to ground. The other comb tooth-shaped electrode of the IDT 55 on the second side is connected to the output terminal 30 via a signal line 35. The one comb tooth-shaped electrode of the IDT 56 on the first side is connected to the other comb tooth-shaped electrode of the IDT 145 on the second side, via the signal line 196 that defines and functions as an interstage connecting line. The other comb tooth-shaped electrode of the IDT 56 on the second side is shunted to ground.

The IDT 141 and the IDT 41 are cascade-connected using the signal line 191 that defines and functions as an interstage connecting line. The first partial IDT portion 143a and the IDT 43 are cascade-connected using the signal line 193 that defines and functions as an interstage connecting line. The second partial IDT portion 143b and the IDT 54 are cascade-connected using the signal line 194 that defines and functions as an interstage connecting line. The IDT 145 and the IDT 56 are cascade-connected using the signal line 196 that defines and functions as an interstage connecting line. It is assumed that each IDT that is shared has the same number of electrode fingers, making it easy to achieve impedance matching and obtaining a favorable filter characteristic as a result.

One end of each of the IDTs 142 and 144 are connected in common to the input terminal 10 by the signal lines 12 and 14. Signals transmitted to the respective IDTs 142 and 144 from the input terminal 10 have the same phase. The input terminal 10 is an unbalanced signal input terminal that inputs an unbalanced signal.

The IDTs 141 and 145 are preferably symmetrical relative to an axis of symmetry that passes through the center of the SAW filter 101 perpendicularly or substantially perpendicularly to the surface acoustic wave propagation direction (that is, a line in FIG. 1 that extends vertically and passes between the first partial IDT portion 143a and the second partial IDT portion 143b). The first partial IDT portion 143a and the second partial IDT portion 143b are also provided symmetrically relative to the stated axis of symmetry. On the other hand, the IDTs 142 and 144 are provided asymmetrically relative to the stated axis of symmetry. Specifically, if the IDT 142 is moved symmetrically relative to the axis of symmetry and then inverted vertically in the direction in which the axis of symmetry extends, the IDT 142 will match the IDT 144.

The first filter section 4 and the second filter section 5 are preferably symmetrical relative to an axis of symmetry that passes through the center of the SAW filter 1 perpendicularly or substantially perpendicularly to the surface acoustic wave propagation direction (that is, a line in FIG. 1 that extends vertically and passes through the center of the reflector 61 in the surface acoustic wave propagation direction). The first filter section 4 included in the surface acoustic wave filter 1, and the surface acoustic wave filter 101, are connected by the signal lines 191 and 193 that define and function as a pair of interconnects. A signal transmitted through the signal line 191 and a signal transmitted through the signal line 193 have mutually opposite phases. The second filter section 5 included in the surface acoustic wave filter 1, and the surface acoustic wave filter 101, are connected by the signal lines 194 and 196 that define and function as a pair of interconnects. A signal transmitted through the signal line 194 and a signal transmitted through the signal line 196 have mutually opposite phases. The orientations of the IDTs are adjusted so that the phases of the signals transmitted through the signal lines 193 and 196 are opposite to the phases of the signals transmitted through the signal lines 191 and 194.

Accordingly, the phase of the signals transmitted to the SAW filter 1 via the signal lines 191 and 194 and the phase of the signals transmitted to the SAW filter 1 via the signal lines 193 and 196 differ by approximately 180° in the pass-band frequency of the surface acoustic wave filter device 100. The signal lines 191 and 194 and the signal lines 193 and 196 define and function as balanced signal input terminals that input balanced signals to the SAW filter 1. Furthermore, the phase of a signal transmitted to the output terminal 20 from the IDT 42 and the phase of a signal transmitted to the output terminal 30 from the IDT 55 differ by 180°. The pair of output terminals 20 and 30 are balanced signal output terminals that output balanced signals from the SAW filter 1. Accordingly, in the surface acoustic wave filter device 100, a balanced output is obtained from the output terminals 20 and 30. The surface acoustic wave filter 1 preferably is a balanced signal input-balanced signal output filter.

The first IDT group 40 in the first filter section 4 and the second IDT group 50 in the second filter section 5 are electrically connected in series via a ground potential between signal lines having a pair of balanced signals on an input signal side. The SAW filter 1 includes two filter sections, namely the first filter section 4 and the second filter section 5, are connected in series. The first IDT group 40 is connected to one of the pair of balanced signal terminals, or in other words, to the output terminal 20. The second IDT group 50 is connected to the other of the pair of balanced signal terminals, or in other words, to the output terminal 30. The first IDT group 40 and the second IDT group 50 are electrically connected in series via a ground potential between the output terminals 20 and 30 having a pair of balanced signals on an output signal side.

The reflector 61 disposed between the first IDT group and the second IDT group 50 preferably is an integrated shared reflector. The SAW filter 1 is configured so that the reflector, of the pair of reflectors in the first filter section 4, disposed on the side closer to the second filter section 5, and the reflector, of the pair of reflectors in the second filter section 5, disposed on the side closer to the first filter section 4, are shared (are common), with these reflectors being replaced by the single reflector 61. It is assumed that the reflector 61 defining and functioning as the shared reflector preferably has an odd number of electrode fingers in reflecting units, namely nine or more, for example. In the present preferred embodiment, the number of electrode fingers in reflecting units in the reflector 61 is 25.

The pair of first reflectors in the first filter section 4 includes the reflector 61 defining and functioning as the shared reflector and the reflector 62. The pair of second reflectors in the second filter section 5 includes the reflector defining and functioning as the shared reflector and the reflector 63. The reflector 62 is disposed on the distanced side from the second filter section 5 with respect to the first IDT group 40, and is provided as a non-shared reflector that is not integrated with the second reflectors. The reflector 63 is disposed on the side spaced from the first filter section 4 with respect to the second IDT group 50, and is provided as a non-shared reflector that is not integrated with the first reflectors.

In the surface acoustic wave filter device 100 according to the first preferred embodiment, the SAW filter 101, which preferably is a five IDT-type longitudinally coupled resonator surface acoustic wave filter, and the SAW filter 1, in which the first filter section 4 and the second filter section 5, which are three IDT-type longitudinally coupled resonator surface acoustic wave filters, are connected in parallel, have a two-stage cascading connection. According to this configuration, ripples and spuriousness caused by resonant mode skew arise only in the SAW filter 101, as opposed to a configuration in which five IDT-type longitudinally coupled resonator surface acoustic wave filters have a two-stage cascading connection. Accordingly, ripples and spuriousness are significantly reduced or prevented. Furthermore, by connecting two of the three IDT-type longitudinally coupled resonator surface acoustic wave filters in parallel, a cross width is approximately the same as with a five IDT-type longitudinally coupled resonator surface acoustic wave filter, and thus there is no significant deterioration in insertion loss.

Figure 2:
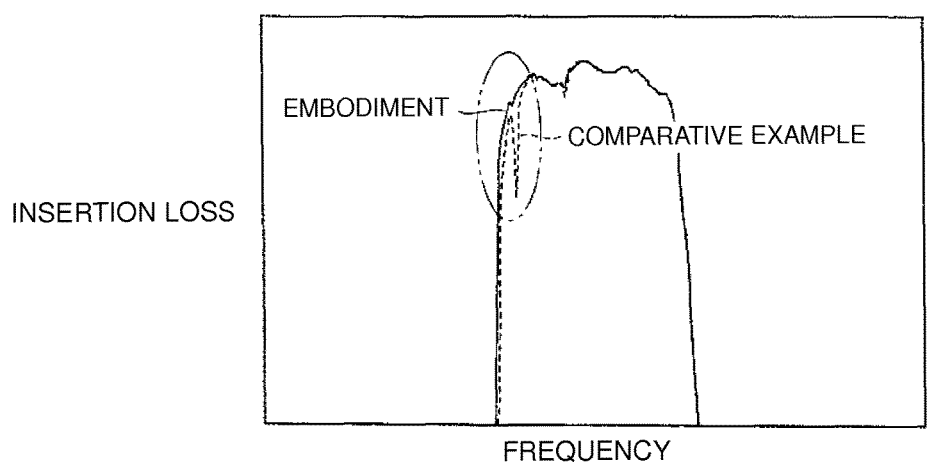
FIG. 2 is a first graph illustrating transmission characteristics of the surface acoustic wave filter device according to the first preferred embodiment of the present invention.

FIG. 2 is a first graph illustrating transmission characteristics of the surface acoustic wave filter 1 according to the first preferred embodiment. In FIG. 2, the horizontal axis represents a frequency, and the vertical axis represents insertion loss. The transmission characteristics relative to the frequency in the surface acoustic wave filter 1 according to the present preferred embodiment are indicated by a solid line in FIG. 2. Furthermore, a broken line indicates the transmission characteristics relative to the frequency of a surface acoustic wave filter according to a comparative example, having almost the same configuration as the surface acoustic wave filter 1 according to the first preferred embodiment but differing in that the number of electrode fingers in reflecting units in the shared reflector is an even number, specifically 24.

Focusing in particular on the region encircled by a double-dot-dash line in FIG. 2, it can be seen that a ripple is present in the pass-band in the comparative example, in which there is an even number of electrode fingers in reflecting units in the shared reflector. On the other hand, with the surface acoustic wave filter 1 according to the first preferred embodiment, in which there is an odd number of electrode fingers in reflecting units in the shared reflector, almost no ripple is produced in the pass-band. It can therefore be seen that ripples are effectively reduced or prevented in the pass-band by setting the number of electrode fingers in reflecting units in the shared reflector to an odd number in the surface acoustic wave filter 1.

Figure 3:
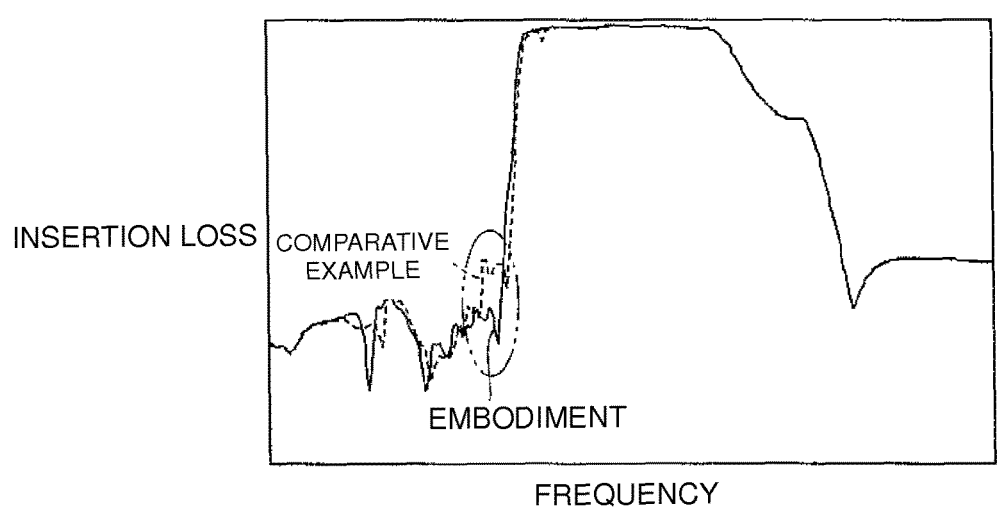
FIG. 3 is a second graph illustrating transmission characteristics of the surface acoustic wave filter device according to the first preferred embodiment of the present invention.

FIG. 3 is a second graph illustrating transmission characteristics of the surface acoustic wave filter 1 according to the first preferred embodiment. In FIG. 3, the horizontal axis represents a frequency, and the vertical axis represents insertion loss. Like FIG. 2, in FIG. 3, the transmission characteristics relative to the frequency in the surface acoustic wave filter 1 according to the present preferred embodiment are indicated by a solid line, and a broken line indicates the transmission characteristics relative to the frequency of a surface acoustic wave filter according to a comparative example, in which there are 24 reflecting units in the shared reflector.

Focusing in particular on the region encircled by a double-dot-dash line in FIG. 3, it can be seen that spuriousness is present near the pass-band in the comparative example, in which there is an even number of electrode fingers in reflecting units in the shared reflector. On the other hand, with the surface acoustic wave filter 1 according to the first preferred embodiment, in which there is an odd number of electrode fingers in reflecting units in the shared reflector, the spuriousness has been reduced. It can therefore be seen that a spuriousness reduction effect is achieved near the pass-band by setting the number of electrode fingers in reflecting units in the shared reflector to an odd number in the surface acoustic wave filter 1.

Figure 4:
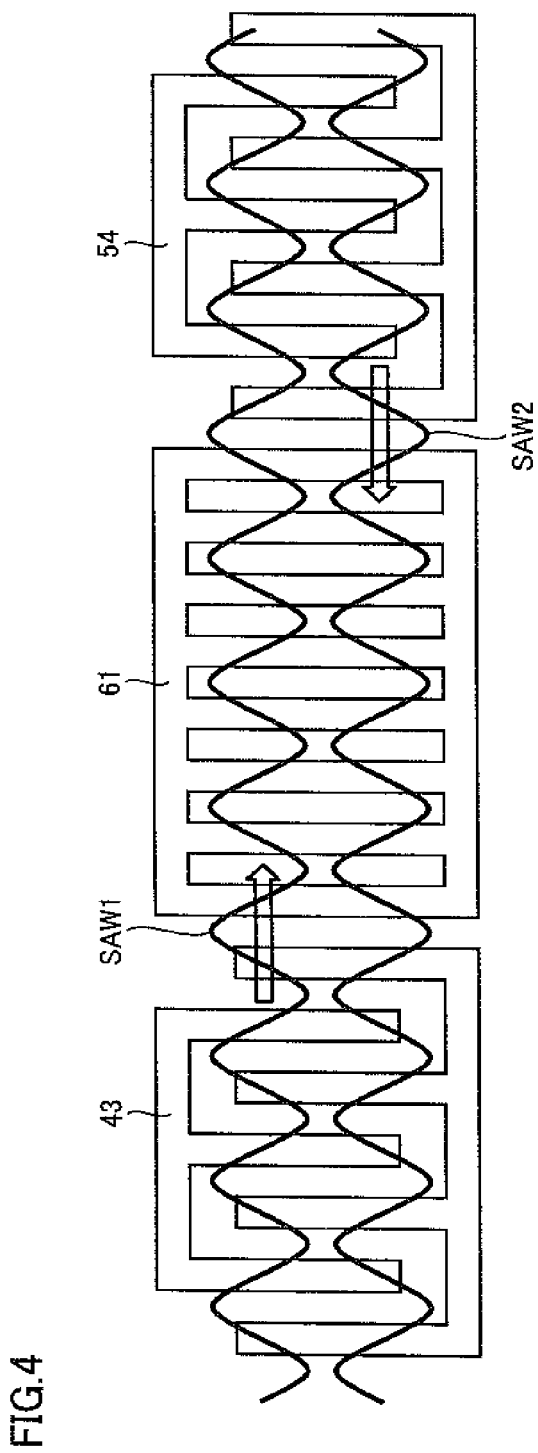
FIG. 4 is a descriptive diagram illustrating an example of surface acoustic wave propagation near a shared reflector in a surface acoustic wave filter according to a first comparative example of a preferred embodiment of the present invention.
Figure 5:
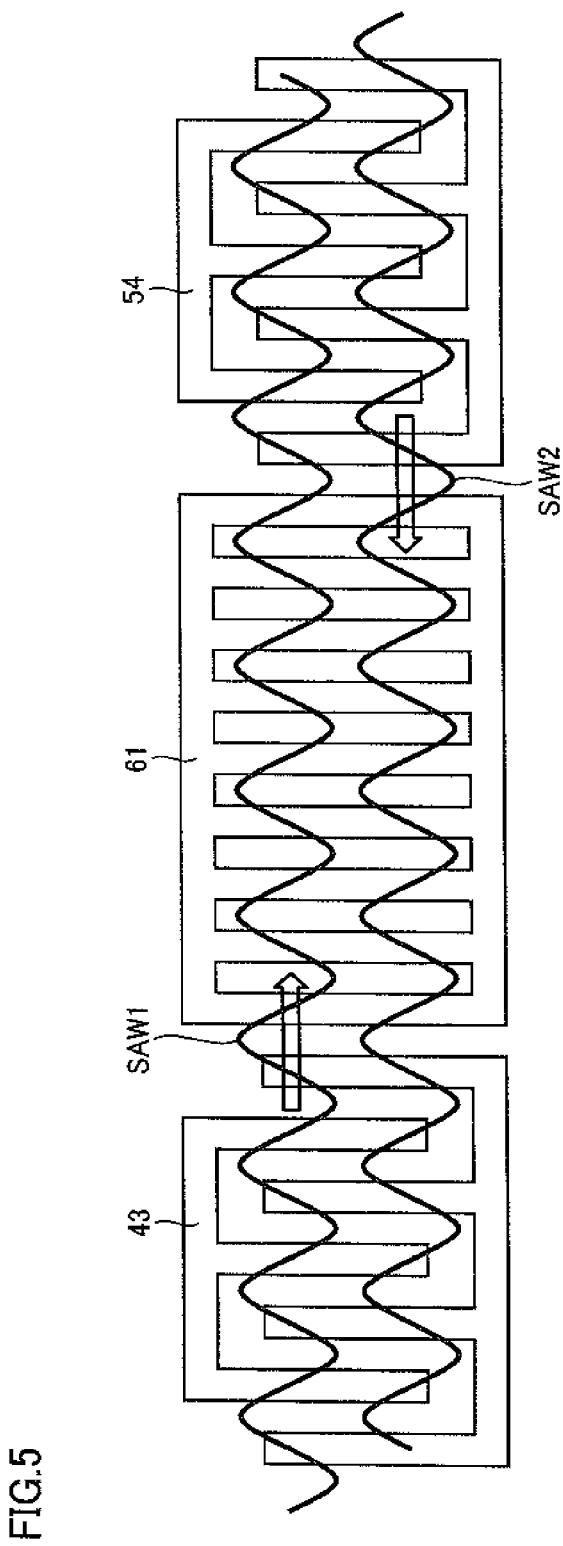
FIG. 5 is a descriptive diagram illustrating an example of surface acoustic wave propagation near a shared reflector in a surface acoustic wave filter according to the first preferred embodiment of a preferred embodiment of the present invention.

FIG. 4 is a descriptive diagram illustrating an example of surface acoustic wave propagation near a shared reflector in a surface acoustic wave filter according to a first comparative example. FIG. 5, meanwhile, is a descriptive diagram illustrating an example of surface acoustic wave propagation near a shared reflector in the surface acoustic wave filter 1 according to the first preferred embodiment. A principle by which ripples and spuriousness increase and decrease depending on whether the number of electrode fingers in reflecting units in the shared reflector is set to an even number or an odd number will be described by comparing FIGS. 4 and 5.

FIG. 4 illustrates the surface acoustic wave filter according to the first comparative example, in which there is an even number of electrode fingers in reflecting units in the shared reflector. In the case where the output terminals 20 and 30 are balanced signal terminals as described above, the phase of a surface acoustic wave SAW1 that propagates through the first IDT group 40 connected to the output terminal 20 will be opposite to the phase of a surface acoustic wave SAW2 that propagates through the second IDT group 50 connected to the output terminal 30. In other words, the surface acoustic waves SAW1 and SAW2, whose phases are shifted by 180°, will propagate through the shared reflector disposed between the first IDT group 40 and the second IDT group 50 from both sides.

Ideally, the entire surface acoustic wave SAW1 that propagates from the first IDT group 40 will be reflected toward the first IDT group 40 by the shared reflector, and the entire surface acoustic wave SAW2 that propagates from the second IDT group 50 will be reflected toward the second IDT group 50 by the shared reflector. However, in actuality, there are surface acoustic waves that escape through the shared reflector. In other words, a portion of the surface acoustic wave SAW1 that propagates from the first IDT group 40 will pass through the shared reflector and escape toward the second IDT group 50. Likewise, a portion of the surface acoustic wave SAW2 that propagates from the second IDT group 50 will pass through the shared reflector and escape toward the first IDT group 40.

The reflector 61 is provided so that a distance between the centers of two adjacent electrode fingers in the surface acoustic wave propagation direction is half of a wave length $\lambda$ of the surface acoustic wave determined by a pitch of the IDT electrode fingers. Accordingly, as shown in FIG. 4, a distance equivalent to two electrode fingers in the surface acoustic wave propagation direction is the same as the length of one of the surface acoustic waves SAW1 and SAW2. In the case where there is an even number of electrode fingers in reflecting units in the shared reflector, the phase of the surface acoustic wave that is not reflected by the shared reflector and escapes to the element on the opposite side will be opposite to the phase of the surface acoustic wave transmitted through that element on the opposite side. In other words, as shown in FIG. 4, the phase of the surface acoustic wave SAW1 that passes through the reflector 61 and escapes toward the IDT 54 will be opposite to the phase of the surface acoustic wave SAW2 that moves toward the reflector 61. Likewise, the phase of the surface acoustic wave SAW2 that passes through the reflector 61 and escapes toward the IDT 43 will be opposite to the phase of the surface acoustic wave SAW1 that moves toward the reflector 61. As a result, the surface acoustic waves that pass through the reflector 61 and escape are unnecessary waves, and are a cause of ripples and spuriousness.

Accordingly, as shown in FIG. 5, if the number of electrode fingers in reflecting units in the shared reflector is set to an odd number, the phase of the surface acoustic wave that passes through the reflector 61 will be shifted by 180°, compared to FIG. 4. As such, the phase of the surface acoustic wave that is not reflected by the reflector 61 and escapes to the element on the opposite side will be the same as the phase of the surface acoustic wave transmitted through that element on the opposite side. In other words, as shown in FIG. 5, the phase of the surface acoustic wave SAW1 that passes through the reflector 61 and escapes toward the IDT 54 will be the same as the phase of the surface acoustic wave SAW2 that moves toward the reflector 61. Likewise, the phase of the surface acoustic wave SAW2 that passes through the reflector 61 and escapes toward the IDT 43 will be the same as the phase of the surface acoustic wave SAW1 that moves toward the reflector 61. Aligning the phases of the surface acoustic waves SAW1 and SAW2 makes it possible to significantly reduce or prevent the occurrence of ripples and spuriousness.

FIGS. 6 to 9 are diagrams illustrating the transmission characteristics of the surface acoustic wave filter in cases where there are three, five, seven, and nine reflecting units in the shared reflector, respectively. In the case where there is an odd number of electrode fingers in reflecting units in the shared reflector, a lower number of electrode fingers in reflecting units in the reflector will result in relatively less of the surface acoustic wave being reflected by the reflector and relatively more of the surface acoustic wave escaping to the element on the opposite side, which will result in slight ripples occurring in the pass-band.

Figure 6:
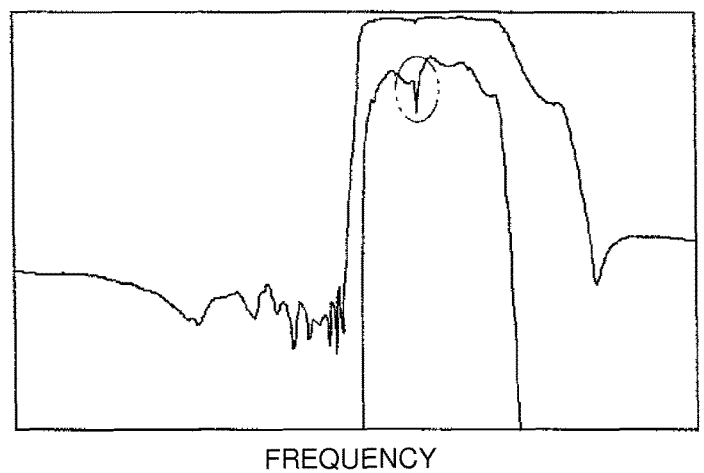
FIG. 6 is a graph illustrating transmission characteristics of a surface acoustic wave filter in the case where there are three electrode fingers in shared reflectors.
Figure 7:
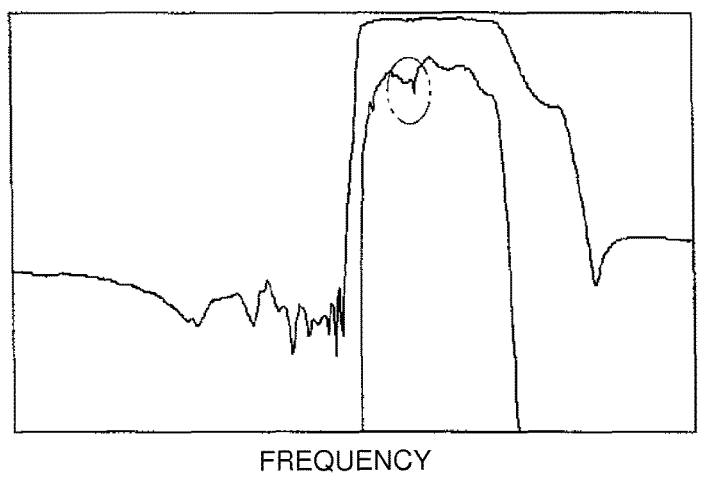
FIG. 7 is a graph illustrating transmission characteristics of a surface acoustic wave filter in the case where there are five shared reflectors.
Figure 8:
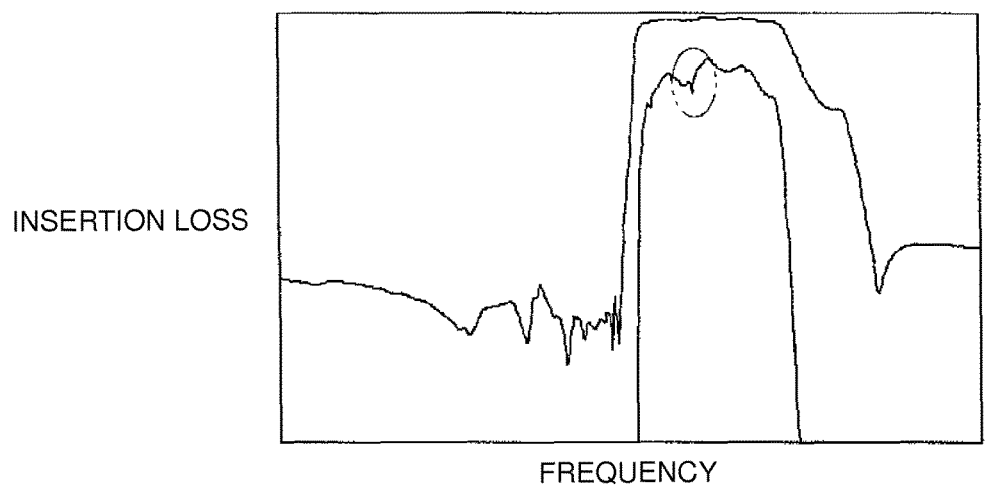
FIG. 8 is a graph illustrating transmission characteristics of a surface acoustic wave filter in the case where there are seven shared reflectors.
Figure 9:
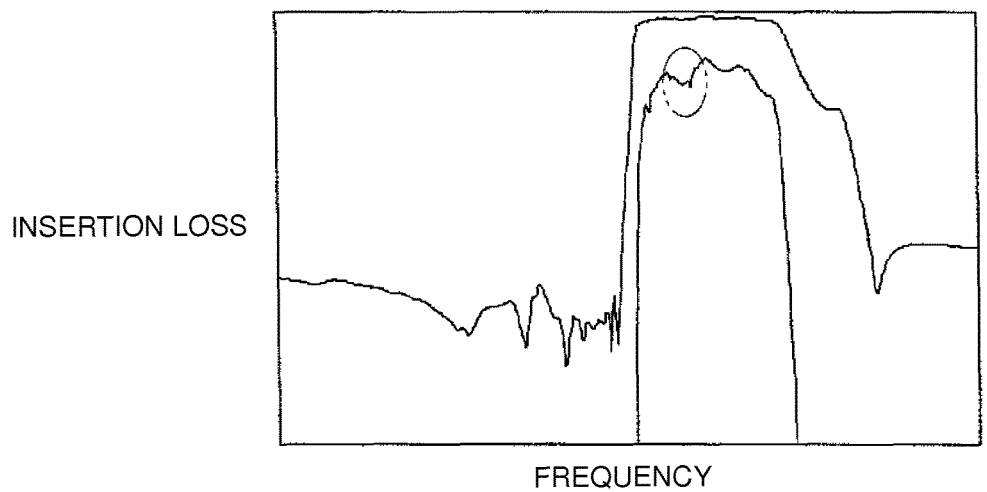
FIG. 9 is a graph illustrating transmission characteristics of a surface acoustic wave filter in the case where there are nine shared reflectors.

As shown in FIG. 6, a ripple is present in the pass-band in the case where there are three reflecting units in the shared reflector. Likewise, as shown in FIGS. 7 and 8, a ripple is present in the pass-band in the case where there are five or seven reflecting units in the shared reflector. However, it can be seen that increasing the number of electrode fingers in the reflecting units in the shared reflector to nine can almost completely prevent ripples from occurring, as shown in FIG. 9. In other words, the number of electrode fingers in the reflecting units in the shared reflector required to achieve the effect of the present preferred embodiment preferably is an odd number of nine or more.

However, it is preferable for the shared reflector to have a lower number of electrode fingers in the reflecting units from the standpoint of miniaturizing the surface acoustic wave filter. Accordingly, it is preferable for an upper limit value for the number of electrode fingers in reflecting units in the shared reflector to be, for example, less than twice the number of electrode fingers in reflecting units in the reflectors 62 and 63, which are non-shared reflectors.

Next, an interval between the reflectors and the IDTs will be described. Assuming that each of the first filter section 4 and the second filter section 5 is considered as one device, the SAW filter 1 will have a horizontally asymmetrical configuration even if there is an odd number of electrode fingers in the reflecting units in the reflector 61, which defines and functions as a shared reflector. Ripples will occur as a result. Such ripples may be reduced by setting an interval between the reflector 61 defining and functioning as a shared reflector and the IDTs 43 and 54 that are adjacent to the reflector 61 (Y, in FIG. 1) and an interval between the reflectors 62 and 63 defining and functioning as non-shared reflectors and the IDTs 41 and 56 that are adjacent to the reflectors 62 and 63 (X, in FIG. 1) to be different.

Figure 10:
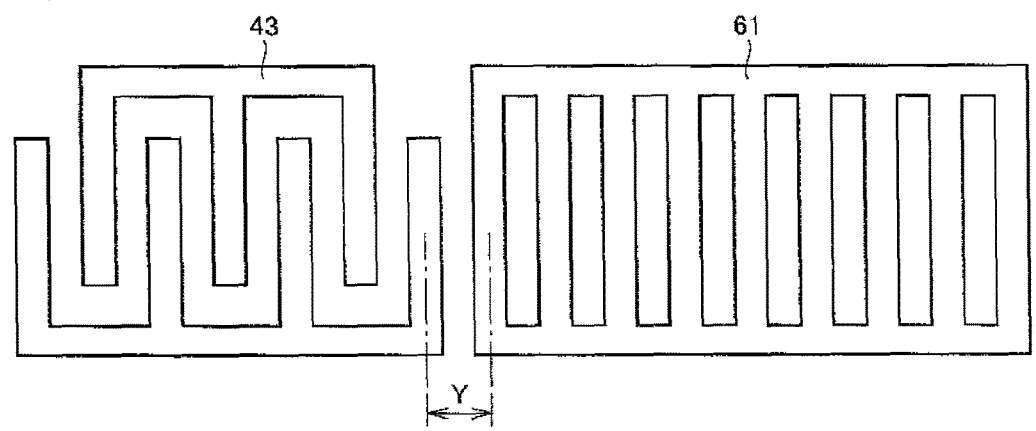
FIG. 10 is a schematic plan view illustrating an interval between a shared reflector and an interdigital transducer.

FIG. 10 is a schematic plan view illustrating the interval between the shared reflector and an IDT. FIG. 10 illustrates the IDT 43 that, among the plurality of IDTs 41, 42, and 43 included in the first IDT group 40, is adjacent to the reflector 61, along with the reflector 61 that defines and functions as a shared reflector.

The IDT 43 is configured so that the dimensions of all electrode fingers in the surface acoustic wave propagation direction and the intervals between all electrode fingers that are adjacent to each other in the surface acoustic wave propagation direction are equal. The wave length $\lambda$ of the surface acoustic wave that propagates through the IDT 43 is set so that the dimensions of the electrode fingers in the surface acoustic wave propagation direction and the intervals between the electrode fingers in the surface acoustic wave propagation direction preferably are about $\lambda/4$, for example. The reflector 61 is configured so that the dimensions of band-shaped reflector electrode fingers arranged in the surface acoustic wave propagation direction and the interval between the reflector electrode fingers in the surface acoustic wave propagation direction preferably are each about $\lambda/4$, for example.

The interval Y between the IDT 43 and the reflector 61 is, as shown in FIG. 10, defined as a distance from a centerline, in the surface acoustic wave propagation direction, of the electrode finger in the IDT 43 that is closest to the reflector 61, to a centerline of an electrode finger on an end portion of the reflector 61 in the surface acoustic wave propagation direction.

Figure 11:
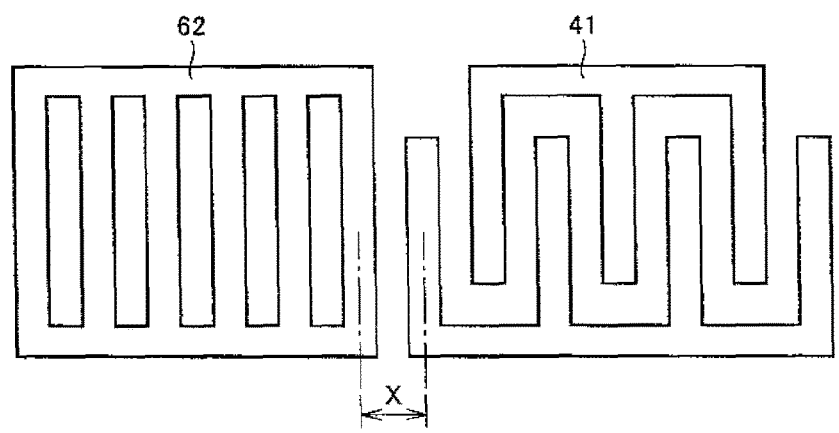
FIG. 11 is a schematic plan view illustrating an interval between a non-shared reflector and an interdigital transducer.

FIG. 11 is a schematic plan view illustrating the interval between a non-shared reflector and an IDT. FIG. 11 illustrates the IDT 41 that, among the plurality of IDTs 41, 42, and 43 included in the first IDT group 40, is adjacent to the reflector 62, along with the reflector 62 that defines and functions as a non-shared reflector.

The IDT 41 is configured so that the dimensions of all electrode fingers in the surface acoustic wave propagation direction and the intervals between all electrode fingers that are adjacent to each other in the surface acoustic wave propagation direction preferably are equal or substantially equal. The wave length $\lambda$ of the surface acoustic wave that propagates through the IDT 41 is set so that the dimensions of the electrode fingers in the surface acoustic wave propagation direction and the intervals between the electrode fingers in the surface acoustic wave propagation direction preferably are about $\lambda/4$, for example. The reflector 62 is provided so that the dimensions of band-shaped reflector electrode fingers arranged in the surface acoustic wave propagation direction and the interval between the reflector electrode fingers in the surface acoustic wave propagation direction preferably are each about $\lambda/4$, for example.

The interval X between the IDT 41 and the reflector 62 is, as shown in FIG. 11, defined as a distance from a centerline, in the surface acoustic wave propagation direction, of the electrode finger in the IDT 41 that is closest to the reflector 62, to a centerline of an electrode finger on an end portion of the reflector 62 in the surface acoustic wave propagation direction.

In the case where even a slight ripple will be problematic in terms of the characteristics of the surface acoustic wave filter device 100, the ripple is able to be reduced by setting the interval X and the interval Y to be different. In the present preferred embodiment, the interval X is set to be greater than the interval Y, and specifically, relative to the wave length $\lambda$ of the surface acoustic waves, X=0.43$\lambda$ and Y=0.42$\lambda$, for example.

Figure 12:
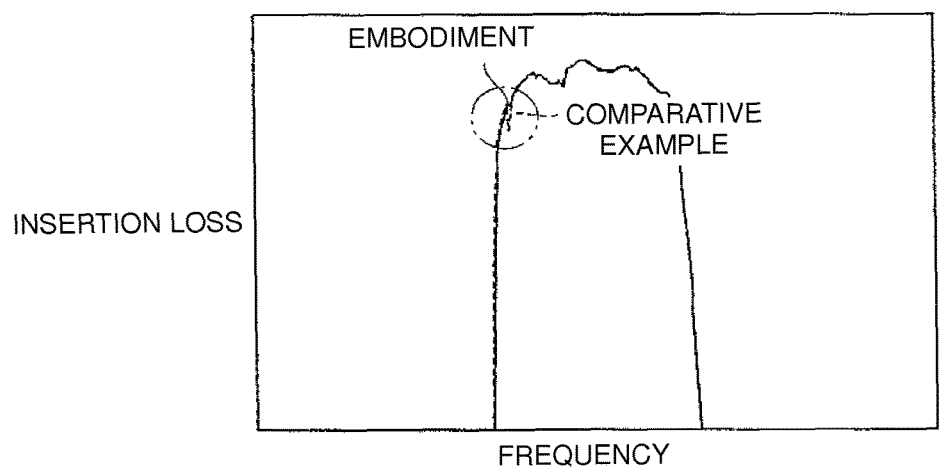
FIG. 12 is a third graph illustrating transmission characteristics of the surface acoustic wave filter device according to the first preferred embodiment of the present invention.

FIG. 12 is a third graph illustrating transmission characteristics of the surface acoustic wave filter 1 according to the first preferred embodiment. In FIG. 12, the horizontal axis represents a frequency, and the vertical axis represents insertion loss. The transmission characteristics relative to the frequency in the surface acoustic wave filter 1 according to the present preferred embodiment, where the intervals X and Y are different at X=0.43$\lambda$ and Y=0.42$\lambda$, for example, are indicated by a solid line in FIG. 12. Furthermore, in FIG.

12, a broken line indicates the transmission characteristics relative to the frequency of a surface acoustic wave filter according to a comparative example, having almost the same configuration as the surface acoustic wave filter 1 according to the first preferred embodiment but differing in that both the intervals X and Y are preferably set to 0.43λ, for example.

Focusing in particular on the region encircled by a double-dot-dash line in FIG. 12, it can be seen that a ripple, while not as large as in the comparative example shown in FIG. 2, is nevertheless present in the pass-band in the comparative example, in which the intervals X and Y are the same. However, the ripple in the pass-band is reduced in the surface acoustic wave filter 1 according to the first preferred embodiment, in which the intervals X and Y are different. Accordingly, it can be seen that setting the intervals between the reflectors and the IDTs to be different further reduces or eliminates ripples in the pass-band.

Second Preferred Embodiment

Figure 13:
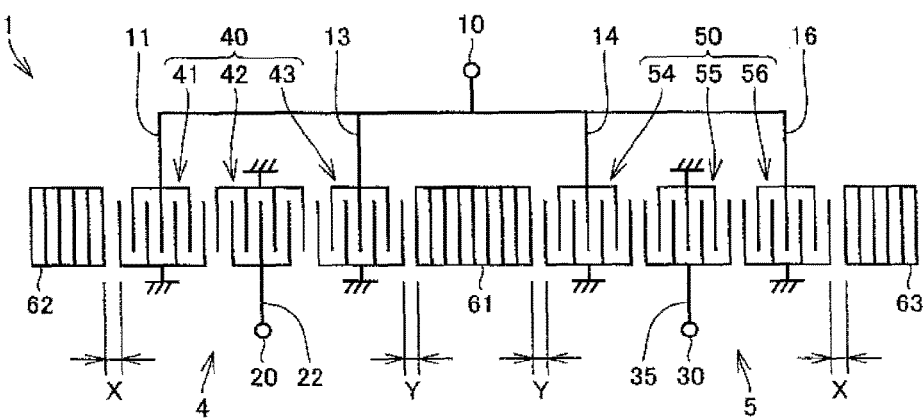
FIG. 13 is a schematic plan view illustrating the overall configuration of a surface acoustic wave filter according to a second preferred embodiment of the present invention.

FIG. 13 is a schematic plan view illustrating the overall configuration of a surface acoustic wave filter 1 according to a second preferred embodiment of the present invention. As in the first preferred embodiment, the SAW filter according to the second preferred embodiment includes the longitudinally coupled resonator first filter section 4 and the longitudinally coupled resonator second filter section 5. The first filter section 4 and the second filter section 5 are three IDT-type longitudinally coupled resonator surface acoustic wave filters. The SAW filter 1 further includes the input terminal 10 and the pair of output terminals 20 and 30.

One comb tooth-shaped electrode of the IDT 41 on the first side is connected to the input terminal 10 via a signal line 11. The other comb tooth-shaped electrode of the IDT 41 on the second side is shunted to ground. One comb tooth-shaped electrode of the IDT 42 on the first side is shunted to ground. The other comb tooth-shaped electrode of the IDT 42 on the second side is connected to the output terminal 20 via a signal line 22. One comb tooth-shaped electrode of the IDT 43 on the first side is connected to the input terminal 10 via a signal line 13. The other comb tooth-shaped electrode of the IDT 43 on the second side is shunted to ground.

One comb tooth-shaped electrode of the IDT 54 on the first side is connected to the input terminal 10 via the signal line 14. The other comb tooth-shaped electrode of the IDT 54 on the second side is shunted to ground. One comb tooth-shaped electrode of the IDT 55 on the first side is shunted to ground. The other comb tooth-shaped electrode of the IDT 55 on the second side is connected to the output terminal 30 via a signal line 35. One comb tooth-shaped electrode of the IDT 56 on the first side is connected to the input terminal 10 via a signal line 16. The other comb tooth-shaped electrode of the IDT 56 on the second side is shunted to ground.

One end of each of the IDTs 41, 43, 54, and 56 are connected in common to the input terminal 10 by the signal lines 11, 13, 14, and 16.

In the respective pairs of comb tooth-shaped electrodes that define the IDTs 41, 43, 54, and 56, the same number of electrode fingers in the comb tooth-shaped electrodes are connected to the input terminal 10. Likewise, in the respective pairs of comb tooth-shaped electrodes that define the IDTs 41, 43, 54, and 56, the same number of electrode fingers in the comb tooth-shaped electrodes are shunted to ground.

The number of electrode fingers in the comb tooth-shaped electrode that, of the pair of comb tooth-shaped electrodes that configure the IDT 42, are connected to the output terminal 20 is the same as the number of electrode fingers in the comb tooth-shaped electrode that, of the pair of comb tooth-shaped electrodes that configure the IDT 55, are shunted to ground. Likewise, the number of electrode fingers in the comb tooth-shaped electrode that, of the pair of comb tooth-shaped electrodes that configure the IDT 42, are shunted to ground is the same as the number of electrode fingers in the comb tooth-shaped electrode that, of the pair of comb tooth-shaped electrodes that configure the IDT 55, are connected to the output terminal 30.

Accordingly, signals transmitted to the respective IDTs 41, 43, 54, and 56 from the input terminal 10 via the signal lines 11, 13, 14, and 16 have the same phase. The input terminal 10 is an unbalanced signal input terminal that inputs an unbalanced signal to the SAW filter 1. On the other hand, the phase of a signal transmitted to the output terminal 20 from the IDT 42 and the phase of a signal transmitted to the output terminal 30 from the IDT 55 differ by approximately 180° in the pass-band frequency of the surface acoustic wave filter device 100. The pair of output terminals 20 and 30 are balanced signal output terminals that output balanced signals from the SAW filter 1. Accordingly, with the SAW filter 1, a balanced output is able to be obtained from the output terminals 20 and 30. The SAW filter 1 preferably is an unbalanced signal input-balanced signal output filter.

The first IDT group 40 in the first filter section 4 and the second IDT group 50 in the second filter section 5 are electrically connected in parallel on an input signal side, and are electrically connected in series via a ground potential on an output signal side. The SAW filter 1 has a configuration in which two filter sections, namely the first filter section 4 and the second filter section 5, are electrically connected in parallel or in series. The first IDT group 40 is connected to one of the pair of balanced signal terminals, or in other words, to the output terminal 20. The second IDT group 50 is connected to the other of the pair of balanced signal terminals, or in other words, to the output terminal 30.

The reflector 61 disposed between the first IDT group and the second IDT group 50 preferably is an integrated shared reflector in the surface acoustic wave filter 1 according to the second preferred embodiment configured in this manner as well, and the number of electrode fingers in reflecting units in the reflector 61 is preferably set to an odd number no less than nine, such as 25, for example. Accordingly, ripples in the pass-band are significantly reduced or prevented, and spuriousness near the pass-band is also significantly reduced or prevented. Furthermore, by setting the interval Y between the IDTs 43 and and the reflector 61 to be different from the interval X between the IDTs 41 and 56 and the reflectors 62 and 63, ripples in the pass-band are reduced even further.

Third Preferred Embodiment

Figure 14:
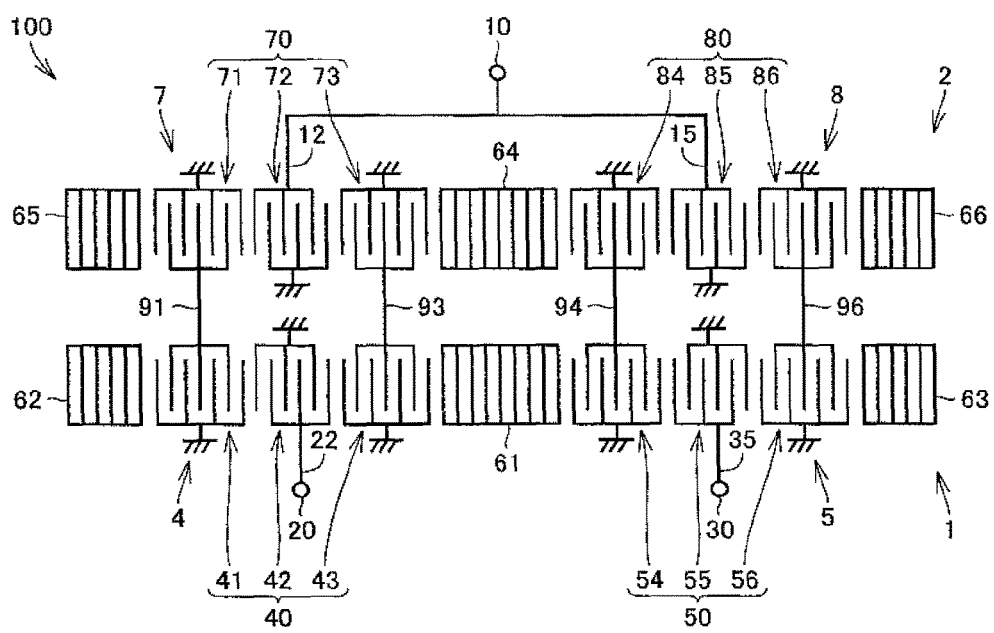
FIG. 14 is a schematic plan view illustrating the overall configuration of a surface acoustic wave filter device according to a third preferred embodiment of the present invention.

FIG. 14 is a schematic plan view illustrating the overall configuration of a surface acoustic wave filter device 100 according to a third preferred embodiment of the present invention. The surface acoustic wave filter device 100 according to the third preferred embodiment includes the same SAW filter 1 as in the first preferred embodiment and a surface acoustic wave filter 2 (also called a "SAW filter 2" hereinafter) defining and functioning as a second surface acoustic wave filter that is different from the surface acoustic wave filter 1. The surface acoustic wave filters 1 and 2 have a two-stage cascading connection.

The SAW filter 2 includes a longitudinally coupled resonator filter section 7 and a longitudinally coupled resonator filter section 8. The filter section 7 and the filter section 8 are disposed adjacent to each other in the surface acoustic wave propagation direction. The filter section 8 is provided next to the filter section 7 in the surface acoustic wave propagation direction.

The filter section 7 includes an IDT group 70. The IDT group 70 includes a plurality of IDTs, namely an IDT 71 defining and functioning as a first IDT, an IDT 72 defining and functioning as a second IDT, and an IDT 73 defining and functioning as a third IDT, for a total of three IDTs. The IDT 71, the IDT 72, and the IDT 73 are arranged in that order in the surface acoustic wave propagation direction. A reflector 64 is disposed on one side of the IDT group 70 in the surface acoustic wave propagation direction. A reflector 65 is disposed on another side of the IDT group 70 in the surface acoustic wave propagation direction. The reflectors 64 and 65 define a pair of reflectors disposed on both sides of the IDT group 70 in the surface acoustic wave propagation direction. The filter section preferably is a three IDT-type longitudinally coupled resonator surface acoustic wave filter.

The filter section 8 includes an IDT group 80. The IDT group 80 includes a plurality of IDTs, namely an IDT 84 defining and functioning as a first IDT, an IDT 85 defining and functioning as a second IDT, and an IDT 86 defining and functioning as a third IDT, for a total of three IDTs. The IDT 84, the IDT 85, and the IDT 86 are arranged in that order in the surface acoustic wave propagation direction. The reflector 64 is disposed on one side of the IDT group 80 in the surface acoustic wave propagation direction. A reflector 66 is disposed on another side of the IDT group 80 in the surface acoustic wave propagation direction. The reflectors 64 and 66 define a pair of reflectors disposed on both sides of the IDT group 80 in the surface acoustic wave propagation direction. The filter section preferably is a three IDT-type longitudinally coupled resonator surface acoustic wave filter.

The IDTs 71, 72, and 73 include pairs of comb tooth-shaped electrodes disposed opposite to each other so that respective electrode fingers are adjacent to each other. The IDTs 84, 85, and 86 include pairs of comb tooth-shaped electrodes disposed opposite to each other so that respective electrode fingers are adjacent to each other.

One comb tooth-shaped electrode of the IDT 71 on the first side is shunted to ground. The other comb tooth-shaped electrode of the IDT 71 on the second side is connected to the one comb tooth-shaped electrode of the IDT 41, via a signal line 91 that defines and functions as an interstage connecting line. One comb tooth-shaped electrode of the IDT 72 on the first side is connected to the input terminal 10 via the signal line 12. The other comb tooth-shaped electrode of the IDT 72 on the second side is shunted to ground. One comb tooth-shaped electrode of the IDT 73 on the first side is shunted to ground. The other comb tooth-shaped electrode of the IDT 73 on the second side is connected to the one comb tooth-shaped electrode of the IDT 43, via a signal line 93 that defines and functions as an interstage connecting line.

One comb tooth-shaped electrode of the IDT 84 on the first side is shunted to ground. The other comb tooth-shaped electrode of the IDT 84 on the second side is connected to the one comb tooth-shaped electrode of the IDT 54, via a signal line 94 that defines and functions as an interstage connecting line. One comb tooth-shaped electrode of the IDT 85 on the first side is connected to the input terminal 10 via a signal line 15. The other comb tooth-shaped electrode of the IDT 85 on the second side is shunted to ground. One comb tooth-shaped electrode of the IDT 86 on the first side is shunted to ground. The other comb tooth-shaped electrode of the IDT 86 on the second side is connected to the one comb tooth-shaped electrode of the IDT 56, via a signal line 96 that defines and functions as an interstage connecting line.

The IDT 71 and the IDT 41 are cascade-connected using the signal line 91 that defines and functions as an interstage connecting line. The IDT 73 and the IDT 43 are cascade-connected using the signal line 93 that defines and functions as an interstage connecting line. The IDT 84 and the IDT 54 are cascade-connected using the signal line 94 that defines and functions as an interstage connecting line. The IDT 86 and the IDT 56 are cascade-connected using the signal line 96 that defines and functions as an interstage connecting line. It is assumed that each IDT that is cascade-connected has the same number of electrode fingers, making it easy to achieve impedance matching and obtaining a favorable filter characteristic as a result.

One end of each of the IDTs 72 and 85 are connected in common to the input terminal 10 by the signal lines 12 and 15. Signals transmitted to the respective IDTs 72 and 85 from the input terminal 10 have the same phase. The input terminal 10 is an unbalanced signal input terminal that inputs an unbalanced signal.

The IDTs 71 and 86 preferably are symmetrical relative to an axis of symmetry that passes through the center of the SAW filter 2 perpendicularly or substantially perpendicularly to the surface acoustic wave propagation direction (that is, a line in FIG. 14 that extends vertically and passes through the center of the reflector 64 in the surface acoustic wave propagation direction). The IDTs 73 and 84 are also provided symmetrically relative to the stated axis of symmetry. On the other hand, the IDTs 72 and 85 are provided asymmetrically relative to the stated axis of symmetry.

The first filter section 4 and the second filter section 5 are provided so as to be symmetrical relative to an axis of symmetry that passes through the center of the SAW filter 1 perpendicularly or substantially perpendicularly to the surface acoustic wave propagation direction (that is, a line in FIG. 14 that extends vertically and passes through the center of the reflector 61 in the surface acoustic wave propagation direction). The first filter section 4 included in the surface acoustic wave filter 1, and the filter section 7 included in the surface acoustic wave filter 2, are connected by the signal lines 91 and 93 that define and function as a pair of interconnects. A signal transmitted through the signal line 91 and a signal transmitted through the signal line 93 have mutually opposite phases. The second filter section 5 included in the surface acoustic wave filter 1, and the filter section 8 included in the surface acoustic wave filter 2, are connected by the signal lines 94 and 96 that define and function as a pair of interconnects. A signal transmitted through the signal line 94 and a signal transmitted through the signal line 96 have mutually opposite phases. The orientations of the IDTs are adjusted so that the phases of the signals transmitted through the signal lines 93 and 96 are opposite to the phases of the signals transmitted through the signal lines 91 and 94.

Accordingly, the phase of the signals transmitted to the SAW filter 1 via the signal lines 91 and 94 and the phase of the signals transmitted to the SAW filter 1 via the signal lines 93 and 96 differ by 180°. The signal lines 91 and 94 and the signal lines 93 and 96 define and function as balanced signal input terminals that input balanced signals to the SAW filter 1. Furthermore, the phase of a signal transmitted to the output terminal 20 from the IDT 42 and the phase of a signal transmitted to the output terminal 30 from the IDT 55 differ by 180°. The pair of output terminals 20 and 30 are balanced signal output terminals that output balanced signals from the SAW filter 1. Accordingly, in the surface acoustic wave filter device 100, a balanced output is able to be obtained from the output terminals 20 and 30. The surface acoustic wave filter 1 preferably is a balanced signal input-balanced signal output filter.

The first IDT group 40 in the first filter section 4 and the second IDT group 50 in the second filter section 5 are electrically connected in parallel on an input signal side, and are electrically connected in series via a ground potential on an output signal side. The SAW filter 1 has a configuration in which two filter sections, namely the first filter section 4 and the second filter section 5, are electrically connected in parallel or in series. The first IDT group 40 is connected to one of the pair of balanced signal terminals, or in other words, to the output terminal 20. The second IDT group 50 is connected to the other of the pair of balanced signal terminals, or in other words, to the output terminal 30.

The reflector 61 disposed between the first IDT group and the second IDT group 50 preferably is an integrated shared reflector in the surface acoustic wave filter 1 according to the third preferred embodiment configured in this manner as well, and the number of electrode fingers in reflecting units in the reflector 61 preferably is set to an odd number no less than nine, such as 25, for example. Accordingly, ripples in the pass-band are significantly reduced or prevented, and spuriousness near the pass-band is also significantly reduced or prevented. Furthermore, by setting the interval Y between the IDTs 43 and and the reflector 61 to be different from the interval X between the IDTs 41 and 56 and the reflectors 62 and 63, ripples in the pass-band are significantly reduced or prevented even further.

Fourth Preferred Embodiment

Figure 15:
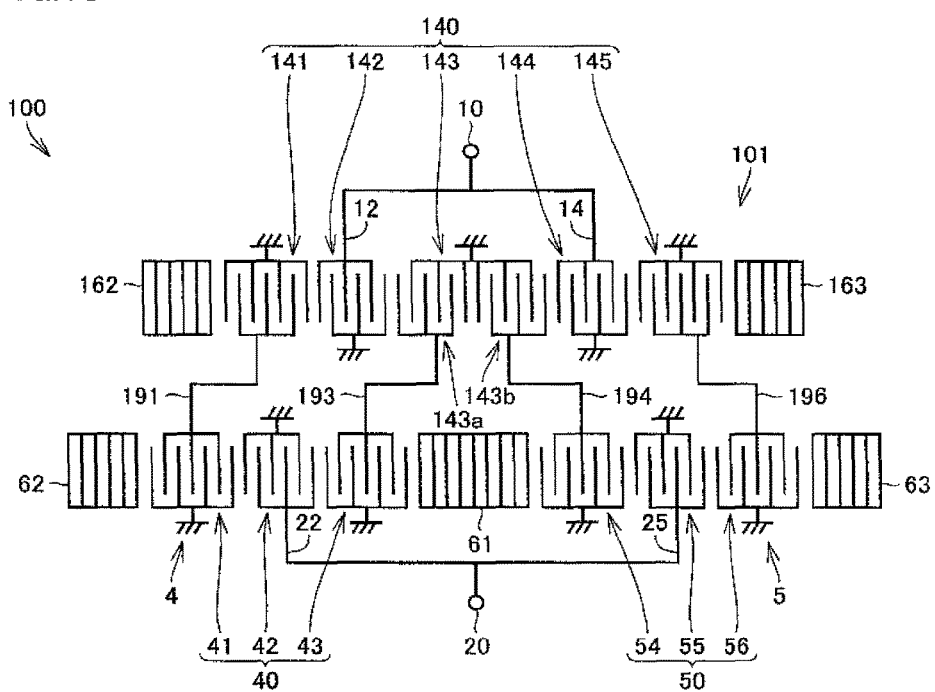
FIG. 15 is a schematic plan view illustrating the overall configuration of a surface acoustic wave filter device according to a fourth preferred embodiment of the present invention.

FIG. 15 is a schematic plan view illustrating the overall configuration of a surface acoustic wave filter device 100 according to a fourth preferred embodiment of the present invention. The surface acoustic wave filter device 100 according to the fourth preferred embodiment has almost the same configuration as that of the first preferred embodiment, and like the first preferred embodiment, includes the SAW filters 1 and 101. However, the surface acoustic wave filter device 100 according to the fourth preferred embodiment differs from the first preferred embodiment in terms of the output terminal configuration.

Specifically, the other comb tooth-shaped electrode of the IDT 42 on the second side is connected to the output terminal 20 via the signal line 22. The other comb tooth-shaped electrode of the IDT 55 on the second side is connected to the output terminal 20 via a signal line 25. One end of each of the IDTs 42 and 55 are connected in common to the output terminal 20 by the signal lines 22 and 25. The signal lines 191 and 194 and the signal lines 193 and 196 define and function as balanced signal input terminals that input balanced signals to the SAW filter 1. The output terminal 20 is an unbalanced signal output terminal that outputs an unbalanced signal from the SAW filter 1. The surface acoustic wave filter 1 preferably is a balanced signal input-unbalanced signal output filter. The first IDT group 40 in the first filter section 4 and the second IDT group 50 in the second filter section 5 are electrically connected in series via a ground potential on an input signal side between a pair of balanced signals, and are electrically connected in parallel to the output terminal 20 on an output signal side. The SAW filter 1 has a configuration in which the first filter section 4 and the second filter section 5 are electrically connected in parallel to the output terminal 20 on the output signal side.

The reflector 61 disposed between the first IDT group and the second IDT group 50 preferably is an integrated shared reflector in the surface acoustic wave filter 1 according to the fourth preferred embodiment configured in this manner as well, and the number of electrode fingers in reflecting units in the reflector 61 preferably is set to an odd number no less than nine, such as 25, for example. Accordingly, ripples in the pass-band are significantly reduced or prevented, and spuriousness near the pass-band is also significantly reduced or prevented. Furthermore, by setting the interval Y between the IDTs 43 and and the reflector 61 to be different from the interval X between the IDTs 41 and 56 and the reflectors 62 and 63, ripples in the pass-band are reduced even further or prevented.

FIG. 16 is a schematic plan view illustrating a duplexer 200 including the surface acoustic wave filter device 100 according to the fourth preferred embodiment. The surface acoustic wave filter device 100 according to the fourth preferred embodiment can be used favorably in duplexers where a large degree of attenuation is required near the pass-band.

As shown in FIG. 16, the duplexer 200 includes an antenna terminal 230 connected to an antenna. The surface acoustic wave filter device 100 is connected to the antenna terminal 230 via a surface acoustic wave resonator 210 for phase adjustment. A receiving-side band-pass filter preferably includes the surface acoustic wave filter device 100 connected between the antenna terminal 230 and a receiving terminal which is the output terminal 20.

On the other hand, a surface acoustic wave filter device 220 that defines a transmitting-side band-pass filter is connected to the antenna terminal 230. In the present preferred embodiment, the surface acoustic wave filter device 220 has a ladder circuit configuration that includes a serial arm connected between the antenna terminal 230 and a transmission terminal 240, a plurality of serial arm resonators S1, S2, and S3 provided in the serial arm, and a plurality of parallel arm resonators P1 and P2 provided between the serial arm and a ground potential. The plurality of serial arm resonators S1, S2, and S3 are connected between the transmission terminal 240 and the antenna terminal 230. The serial arm resonators S1, S2, and S3 and the parallel arm resonators P1 and P2 each include a one-port surface acoustic wave resonator.

The duplexer 200 is preferably provided by forming electrode structures as shown in the drawings on a primary surface of a piezoelectric substrate. Note that it is not necessary for the receiving-side band-pass filter and the transmitting-side band-pass filter to be formed on the same piezoelectric substrate, and these filters may be provided on different piezoelectric substrates.

The foregoing describes an example in which the duplexer 200 includes the surface acoustic wave filter device 100 according to the fourth preferred embodiment, illustrated in FIG. 15. Instead of the surface acoustic wave filter device 100 according to the fourth preferred embodiment, the duplexer 200 may include the surface acoustic wave filter device 100 according to the first or third preferred embodiments, or may include one of the surface acoustic wave filters 1 according to the first through fourth preferred embodiments. Furthermore, in addition to the duplexer 200, the surface acoustic wave filter 1 or the surface acoustic wave filter device 100 according to the respective preferred embodiments may be applied in any branching filter, such as a triplexer, a multiplexer, a diplexer, or the like.

Although the foregoing has described preferred embodiments of the present invention, it should be noted that the configurations of the respective preferred embodiments may be combined as appropriate. Furthermore, the preferred embodiments disclosed herein are to be understood in all ways as exemplary and in no ways limiting. The scope of the present invention is defined by the appended claims rather than by the foregoing descriptions, and any meanings equivalent to the scope of the appended claims as well as all modifications made within the scope of the appended claims are intended to be encompassed thereby.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave filter comprising:
    a piezoelectric substrate;
    a longitudinally coupled resonator first filter section provided on the piezoelectric substrate; and
    a longitudinally coupled resonator second filter section that is electrically connected to the first filter section in parallel or in series on at least one of an input signal side and an output signal side and that is provided on the piezoelectric substrate next to the first filter section in a surface acoustic wave propagation direction; wherein
    the first filter section includes a first interdigital transducer group including a plurality of interdigital transducers (IDT) arranged in the surface acoustic wave propagation direction and a pair of first reflectors disposed on each side of the first interdigital transducer group in the surface acoustic wave propagation direction;
    the second filter section includes a second interdigital transducer group including a plurality of interdigital transducers arranged in the surface acoustic wave propagation direction and a pair of second reflectors disposed on each side of the second interdigital transducer group in the surface acoustic wave propagation direction;
    the first reflector and the second reflector disposed between the first interdigital transducer group and the second interdigital transducer group are defined by an integrated shared reflector;
    a number of electrode fingers in reflecting units in the integrated shared reflector is an odd number of no less than nine;
    the pair of first reflectors includes the shared reflector and a non-shared reflector that is not integrated with the second reflector; and
    an interval between the shared reflector and an interdigital transducer of the plurality of interdigital transducers in the first interdigital transducer group that is adjacent to the shared reflector, is different from an interval between the non-shared reflector and an interdigital transducer of the plurality of interdigital transducers in the first interdigital transducer group that is adjacent to the non-shared reflector.

2. The surface acoustic wave filter according to claim 1, wherein the number of electrode fingers in the reflecting units in the integrated shared reflector is 25.

3. The surface acoustic wave filter according to claim 1, wherein a first interval defined by a distance from a centerline, in the surface acoustic wave propagation direction, of an electrode finger in one of the interdigital transducers closest to the integrated shared reflector, to a centerline of an electrode finger on an end portion of the integrated shared reflector in the surface acoustic wave propagation direction is different from a second interval defined by a distance from a centerline, in the surface acoustic wave propagation direction, of the electrode finger in the interdigital transducer closest to the non-shared reflector, to a centerline of an electrode finger on an end portion of the non-shared reflector in the surface acoustic wave propagation direction.

4. A surface acoustic wave filter device comprising:
    the surface acoustic wave filter according to claim 1; and
    a second surface acoustic wave filter cascade-connected to the surface acoustic wave filter.

5. The surface acoustic wave filter device according to claim 4, wherein the surface acoustic wave filter and the second surface acoustic wave filter are cascade-connected in a two-stage cascading connection.

6. The surface acoustic wave filter device according to claim 5, wherein the first filter section and the second filter section of the surface acoustic wave filter are each a three IDT longitudinally coupled resonator surface acoustic wave filter and the second surface acoustic wave filter is a five IDT longitudinally coupled resonator surface acoustic wave filter.

7. The surface acoustic wave filter device according to claim 4, wherein the first filter section and the second filter section of the surface acoustic wave filter are each a three IDT longitudinally coupled resonator surface acoustic wave filter and the second surface acoustic wave filter is a five IDT longitudinally coupled resonator surface acoustic wave filter.

8. The surface acoustic wave filter device according to claim 4, wherein the first filter section and the second filter section of the surface acoustic wave filter are each a three IDT longitudinally coupled resonator surface acoustic wave filter and the second surface acoustic wave filter is a three IDT longitudinally coupled resonator surface acoustic wave filter.

9. The surface acoustic wave filter device according to claim 4, further comprising:
    a pair of interconnects that define a cascading connection between the surface acoustic wave filter and the second surface acoustic wave filter; wherein
    a phase of one signal transmitted through one interconnect of the pair of interconnects and a phase of another signal transmitted through the other interconnect of the pair of interconnects are mutually opposite.

10. The surface acoustic wave filter device according to claim 4, wherein the second surface acoustic wave filter includes a first interdigital transducer, a second interdigital transducer, a third interdigital transducer, a fourth interdigital transducer, and a fifth interdigital transducer arranged in that order in the surface acoustic wave propagation direction.

11. The surface acoustic wave filter device according to claim 10, wherein
    the third interdigital transducer is divided into a first partial interdigital transducer portion and a second partial interdigital transducer portion on both sides in the surface acoustic wave propagation direction; and the first partial interdigital transducer portion is cascade-connected to the first filter section and the second partial interdigital transducer portion is cascade-connected to the second filter section.

12. The surface acoustic wave filter device according to claim 4, wherein a direction along which surface acoustic waves propagate in the surface acoustic wave filter and a direction along which surface acoustic waves propagate in the second surface acoustic wave filter are parallel or substantially parallel to each other.

13. A duplexer comprising the surface acoustic wave filter device according to claim 4.

14. A duplexer comprising the surface acoustic wave filter according to claim 1.

15. A surface acoustic wave filter comprising:
a piezoelectric substrate;
a longitudinally coupled resonator first filter section provided on the piezoelectric substrate; and
a longitudinally coupled resonator second filter section that is electrically connected to the first filter section in parallel or in series on at least one of an input signal side and an output signal side and that is provided on the piezoelectric substrate next to the first filter section in a surface acoustic wave propagation direction; wherein
the first filter section includes a first interdigital transducer group including a plurality of interdigital transducers arranged in the surface acoustic wave propagation direction and a pair of first reflectors disposed on each side of the first interdigital transducer group in the surface acoustic wave propagation direction;
the second filter section includes a second interdigital transducer group including a plurality of interdigital transducers arranged in the surface acoustic wave propagation direction and a pair of second reflectors disposed on each side of the second interdigital transducer group in the surface acoustic wave propagation direction;
the first reflector and the second reflector disposed between the first interdigital transducer group and the second interdigital transducer group are defined by an integrated shared reflector;
a number of electrode fingers in reflecting units in the integrated shared reflector is an odd number of no less than nine; and
the integrated shared reflector is located such that a distance between centers of two adjacent electrode fingers in the surface acoustic wave propagation direction is half of a wave length of the surface acoustic wave determined by a pitch of electrode fingers of the interdigital transducers.

16. A surface acoustic wave filter comprising:
a piezoelectric substrate;
a longitudinally coupled resonator first filter section provided on the piezoelectric substrate; and
a longitudinally coupled resonator second filter section that is electrically connected to the first filter section in parallel or in series on at least one of an input signal side and an output signal side and that is provided on the piezoelectric substrate next to the first filter section in a surface acoustic wave propagation direction; wherein
the first filter section includes a first interdigital transducer group including a plurality of interdigital transducers arranged in the surface acoustic wave propagation direction and a pair of first reflectors disposed on each side of the first interdigital transducer group in the surface acoustic wave propagation direction;
the second filter section includes a second interdigital transducer group including a plurality of interdigital transducers arranged in the surface acoustic wave propagation direction and a pair of second reflectors disposed on each side of the second interdigital transducer group in the surface acoustic wave propagation direction;
the first reflector and the second reflector disposed between the first interdigital transducer group and the second interdigital transducer group are defined by an integrated shared reflector;
a number of electrode fingers in reflecting units in the integrated shared reflector is an odd number of no less than nine; and
the integrated shared reflector is configured such that dimensions of the electrode fingers thereof arranged in the surface acoustic wave propagation direction and an interval between the electrode fingers thereof in the surface acoustic wave propagation direction are each about $\lambda/4$, where $\lambda$ is a wavelength of a surface acoustic wave that propagates in the surface acoustic wave propagation direction.

* * * * *